United States Patent [19]

Honda et al.

[11] Patent Number: 4,568,838

[45] Date of Patent: Feb. 4, 1986

[54] CONTROL CIRCUIT FOR A SEMICONDUCTOR ELEMENT WITH A CONTROL ELECTRODE

[75] Inventors: Kazuo Honda; Yasuo Matsuda; Shuji Musha, all of Hitachi, Japan

[73] Assignee: Hitachi, Ltd., Tokyo, Japan

[21] Appl. No.: 750,229

[22] Filed: Jun. 28, 1985

Related U.S. Application Data

[63] Continuation of Ser. No. 382,560, May 27, 1982, abandoned.

[30] Foreign Application Priority Data

May 29, 1981 [JP] Japan .................................. 56-83194

[51] Int. Cl.$^4$ ........................ H03K 17/60; H03K 3/42
[52] U.S. Cl. .................................. 307/254; 307/252 C; 307/311
[58] Field of Search .................. 307/252 C, 254, 255, 307/310, 311

[56] References Cited

U.S. PATENT DOCUMENTS

| | | | |
|---|---|---|---|
| 4,115,707 | 9/1978 | Kalfus | 307/252 C |
| 4,146,826 | 3/1979 | Wojslawowicz | 307/252 C |
| 4,293,779 | 10/1981 | Nestler et al. | 307/252 C |

FOREIGN PATENT DOCUMENTS

144860  11/1979  Japan .............................. 307/252 C

Primary Examiner—Stanley D. Miller
Assistant Examiner—B. P. Davis
Attorney, Agent, or Firm—Antonelli, Terry & Wands

[57] ABSTRACT

A control circuit for a semiconductor element with a control electrode includes a signal transmission circuit, in which two switching elements made conductive when a control signal is supplied from a control signal source to the switching elements through a signal insulating element, are provided so that the control signal is transferred to a turn-on circuit for the semiconductor element only when the switching elements are simultaneously made conductive.

15 Claims, 7 Drawing Figures

CONTROL CIRCUIT FOR A SEMICONDUCTOR ELEMENT WITH A CONTROL ELECTRODE

This application is a continuation of application Ser. No. 382,560, filed May 27, 1982, and now abandoned.

The present invention relates to a control circuit for a semiconductor element with a control electrode, and more particularly to a control circuit which includes a signal transmission circuit provided with a device for preventing malfunctions.

In general, a control circuit for a semiconductor element with a control electrode includes at least both of a turn-on circuit for supplying a turn-on signal to the semiconductor element and a signal transmission circuit for transmitting a control signal from a control signal source to the turn-on circuit through a signal insulating element.

The most typical example of conventional signal transmission circuit systems is a system in which the signal insulating element, for example, a photocoupler, includes an element acting as a photo-transistor. In this system, however, the photo-transistor has a long response time, and the transfer efficiency (hereinafter referred to as "CTR") of the photo-coupler fluctuates widely. Accordingly, it is difficult to appropriately determine circuit constants of a peripheral circuit.

On the other hand, there has been known another system, in which the photo-coupler includes an element acting as a photo-diode and the photo-current from the photo-diode is amplified by NPN and PNP transistors each connected to the photo-coupler from the outside. In this system, variations in the photo-current outputted from the photo-coupler are one-third of the variations in the above-mentioned CTR, and moreover response time can be shortened. However, in the case where a signal transmission circuit according to this system is included in an inverter circuit, as in the same manner as a case where the photo-coupler acts as a phototransistor, there is a fear of the inverter circuit performing malfunctions due to a noise current, which flows through a stray capacity between electrodes of the photo-coupler in response to a change in electric potential at an output point of the inverter circuit. The above-mentioned malfunctions are also generated in the case where a pulse transformer is used in place of the photo-coupler to form the signal insulating element.

It is accordingly an object of the present invention to provide a control circuit for a semiconductor element with a control electrode which has a high noise-resisting capability, is short in response time, and is not easily susceptible to variations in the characteristics of a signal insulating element such as a transfer efficiency (CTR).

A gist of the present invention resides in that a pair of switching elements which are made conductive when a control signal is supplied thereto through a signal insulating element, are provided on two independent paths which are arranged in such a manner that a displacement current (noise current) flowing through electric charges stored by a stray capacity around the signal insulating element in case of a change in a voltage at the output point of the inverter circuit are not allowed to flow through the paths at the same time, and in that the control signal is transferred to a turn-on circuit for a semiconductor element with a control electrode only when the switching elements are simultaneously made conductive.

According to the above-mentioned circuit construction, there is no fear of a semiconductor element with a control electrode performing malfunctions due to a noise current, which is generated in response to a change in electric potential at an output point of an inverter circuit. Accordingly, the light receiving element in the photo-coupler serving as the signal insulating element can be operated as a photo-diode. Thus, a control circuit for a semiconductor element with a control electrode can be obtained which is short in response time and is unlikely to be influenced by the variation of CTR. The above-mentioned semiconductor element with a control electrode includes a gate turn-off thyristor, an ordinary thyristor, a transistor, and others.

The present invention will be apparent from the following detailed description taken in conjunction with the accompanying drawings, in which.

Prior to explaining embodiments of the present invention, explanation will be made on the reasons why a noise current causes malfunctions in the prior art.

Figure 1:
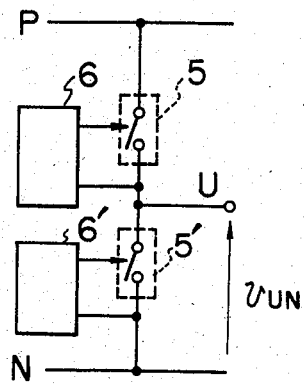
FIG. 1 is a circuit diagram for giving a general idea of a one-phase part of an inverter and for defining an output potential.
Figure 2:
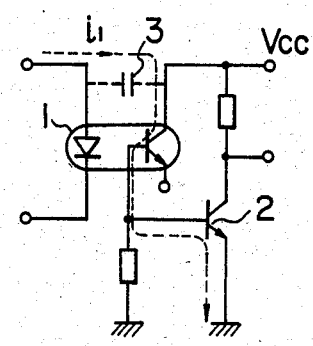
FIGS. 2 and 3 are circuit diagrams each for showing a photo-coupler including an element acting as a photo-diode and for indicating a path of noise current.
Figure 3:
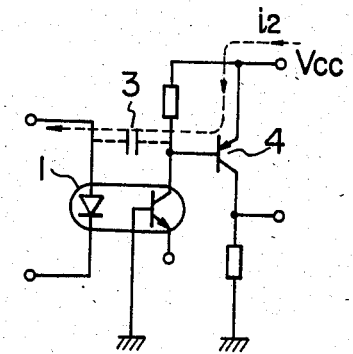
Figure 4:
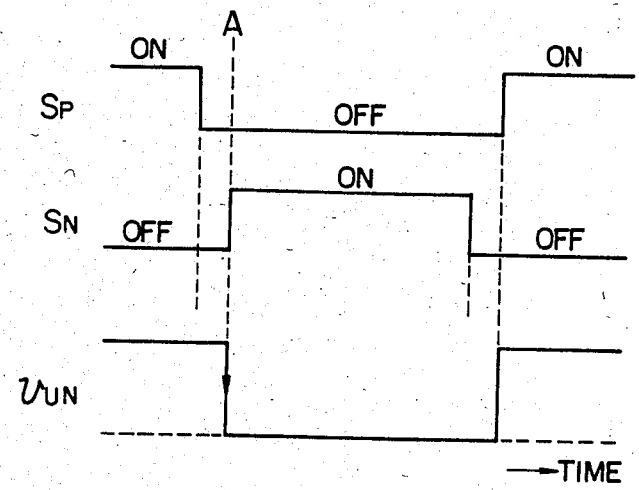
FIG. 4 is a waveform chart for explaining an erroneous operation of an inverter at no-load running.
Figure 5:
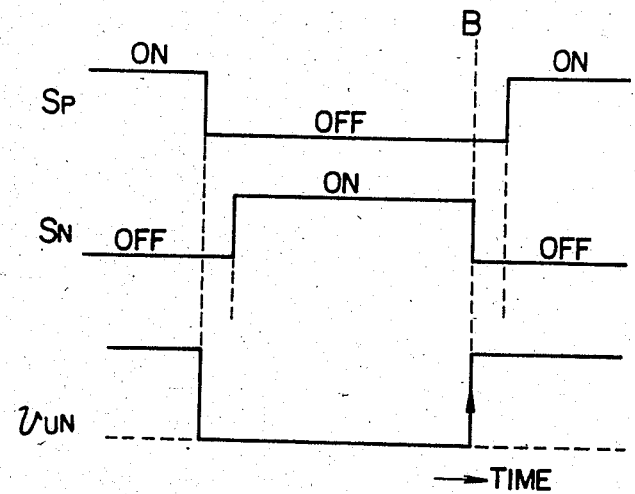
FIG. 5 is a waveform chart for explaining an erroneous operation of an inverter at load running.

Referring now to FIG. 1, let us consider a gate circuit 6 for opening and closing a main switch 5 disposed on the P-side of a one-phase part of an inverter. A potential $v_{UN}$ at a point U, to which the gate circuit 6 is connected, is varied every time each of main switches 5 and 5' is opened or closed. In the case where a circuit system shown in FIG. 2 is employed as a signal transmission circuit in the gate circuit 6, the circuit shown in FIG. 1 performs, for example, the following operation at such a no-load running time of the inverter as shown in FIG. 4. That is, at a phase A where a gate input signal Sp on the P-side is kept at the OFF-state and the potential $v_{UN}$ at the point U is changed from positive to negative, a noise current $i_1$ passes through a capacity 3 between electrodes of a photo-coupler 1 and flows along a path shown in FIG. 2. Thus, a transistor 2 is erroneously operated, and a false turn-on pulse is thereby supplied to the main switch 5. On the other hand, in the case where a circuit system shown in FIG. 3 is employed as a signal transmission circuit in the gate circuit 6, the circuit shown in FIG. 1 performs, for example, the following operation at such a load running time of the inverter as shown in FIG. 5. That is, at a phase B where the gate input signal Sp on the P-side is kept at the OFF-state and the potential $v_{UN}$ at the point U is changed from negative to positive, a noise current $i_2$ flows along a path shown in FIG. 3. Thus, a transistor 4 is erroneously operated, and a false turn-on pulse is thereby supplied to the main switch 5. In either case, it is impossible to operate the inverter in the whole operation range from no-load running to full-load running, without any trouble.

According to the present invention, in order to prevent the malfunctions due to the noise currents, an AND circuit is made up of a plurality of switches so that a succeeding stage is not affected by a malfunction of one of the switches.

Now, the present invention will be explained in detail, on the basis of depicted embodiments.

Figure 6:
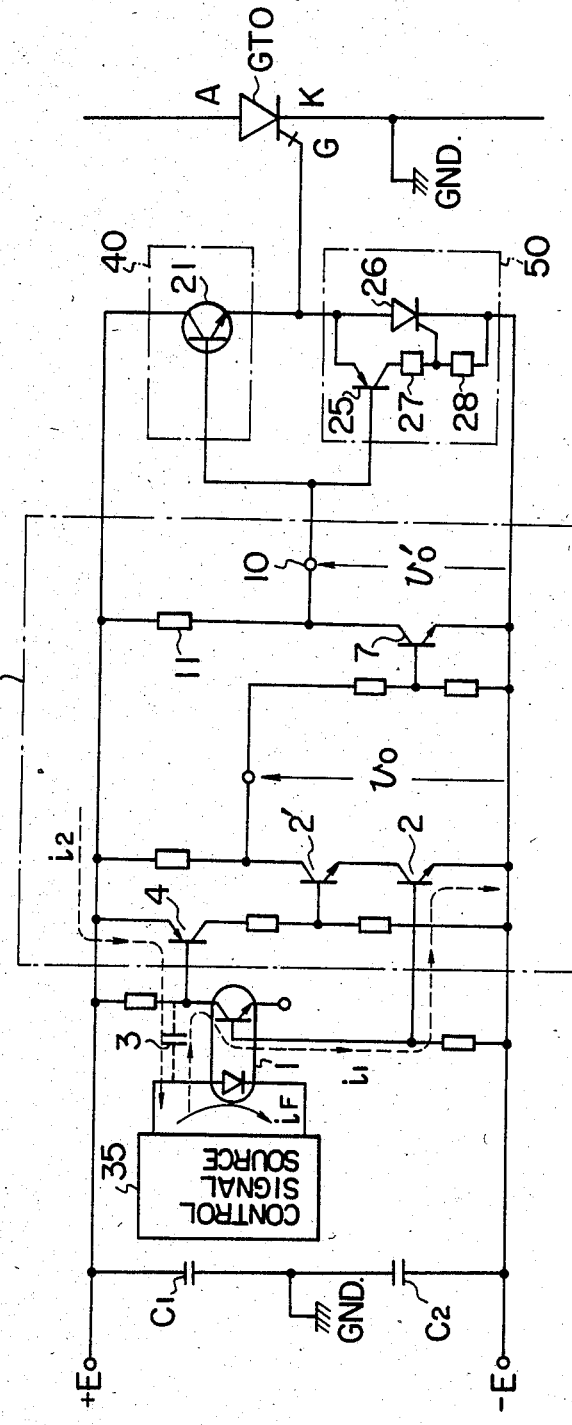
FIG. 6 is a circuit diagram showing an embodiment of a gate circuit according to the present invention for controlling a gate turn-off thyristor.

FIG. 6 shows an embodiment of a gate circuit according to the present invention for controlling a gate turn-off thyristor (hereinafter referred to as "GTO"), which is a semiconductor element with a control electrode. Referring to FIG. 6, a photo-coupler 1 transmits a control signal $i_F$ from a control signal source 35 to a gate circuit in a state that the control signal source 35 and the gate circuit are electrically insulated from each other. A signal transmission circuit 30 includes transistors 2, 2', 4 and 7. An output potential $v_o'$ of the circuit 30 becomes high or low according to whether the control signal $i_F$ takes a high level or a low level. An output terminal 10 is connected to both of a turn-on circuit 40 for a GTO and a turn-off circuit 50 for the GTO. The turn-on circuit 40 is formed of a transistor 21, and the turn-off circuit 50 is made up of a transistor 25, a thyristor 26, and resistors 27 and 28. The turn-on circuit 40 and the turn-off circuit 50 are connected to a turn-on power source (namely, a power source for turning on the GTO) $C_1$ and a turn-off power source (namely, a power source for turning off the GTO) $C_2$, respectively. A junction of the circuits 40 and 50 is connected to the gate G of the GTO.

Next, the operation of the circuit shown in FIG. 6 will be explained. When the control signal $i_F$ having a high level flows from the control signal source 35 into a light emitting diode of the photocoupler 1 so that a forward current is supplied to the light emitting diode, a photo-current flows between the collector and base of a photo-transistor. The photocurrent becomes a base current of each of the transistors 2 and 4. As a result, the transistors 2 and 4 are put in the ON-state, and a collector current of the transistor 2 and that of the transistor 4 flow as a base current of the transistor 2'. That is, the path of the base current of the transistor 2' is formed only when both of the transistors 2 and 4 are put in the ON-state, that is, the logical AND is obtained between the transistors 2 and 4. At this time, an output $v_o$ takes a low level (namely, L-level). Accordingly, the transistor 7 is put in the OFF-state, and therefore the output potential $v_o'$ at the output terminal 10 takes a high level (namely, H-level). Thus, a base current flows into the transistor 21 to make it conductive. That is, a turn-on gate current (namely, a gate current for turning on the GTO) flows through the following path: turn-on power source $C_1$—transistor 21—gate of GTO—cathode of GTO—Gnd—$C_1$.

When the GTO is turned off, no forward current flows through the light emitting diode of the photocoupler 1, and therefore all of the transistors 2, 2' and 4 are put in the OFF-state. Thus, the output $v_o$ takes the H-level. Accordingly, the transistor 7 is put in the ON-state, and the potential $v_o'$ at the output terminal 10 takes the L-level. Thereby, a reverse base current to the transistor 21 first flows through the following path: turn-off power source $C_2$—Gnd—cathode of GTO—gate of GTO—emitter of transistor 21—base of transistor 21—terminal 10—transistor 7—$C_2$. Thus, the transistor 21 is rapidly put in the OFF-state. Subsequently, a current for driving the transistor 25 flows through a path $C_2$—Gnd—cathode of GTO—gate of GTO—emitter of transistor 25—base of transistor 25—terminal 10—transistor 7—$C_2$, to put the transistor 25 in the ON-state. Then, a gate current for the thyristor 26 flows through a path $C_2$—Gnd—cathode of GTO—gate of GTO—transistor 25—resistor 27—gate of thyristor 26—cathode of thyristor 26—$C_2$, to turn on the thyristor 26. Thus, a turn-off gate current (namely, a gate current for turning off the GTO) flows through a path $C_2$—Gnd—cathode of GTO—gate of GTO—thyristor 26—$C_2$, to turn off the GTO. When the GTO is turned off and the turn-off gate current becomes zero, the thyristor 26 is naturally turned off. However, so long as the transistor 7 is put in the ON-state, the transistor 25 is maintained at the ON-state, and therefore a reverse bias voltage is applied between the gate G and cathode K of the GTO through the resistor 27.

According to the above-mentioned circuit configuration of the present embodiment, even if the transistor 2 is driven on by a noise current $i_1$ at a turn-off period of the GTO, a current path for causing the base current of the transistor 2' to flow is not formed so long as the transistor 4 is kept at the OFF-state. Therefore, the level of each of the outputs $v_o$ and $v_o'$ is kept unchanged, that is, the output $v_o$ is maintained at the H-level and the output potential $v_o'$ is maintained at the L-level. Further, when the transistor 4 is driven on by a noise current $i_2$, the output $v_o$ and output potential $v_o'$ are kept at the H-level and L-level, respectively, for a similar reason. It is a matter of course that the noise currents $i_1$ and $i_2$ are not simultaneously generated.

In the present embodiment, the transistor 2' is driven only when the logical AND is obtained between the transistors 2 and 4, that is, only when both of the transistors 2 and 4 are put in the ON-state. Accordingly, even if either of the transistors 2 and 4 is affected by the noise current, a succeeding stage is not subjected to the influence of the noise current. Accordingly, the present embodiment has a high noise-resisting capability. Further, since the photo-coupler includes the light receiving element acting as a photo-diode, the response time of the photo-coupler is short, and it is difficult to be influenced by the variation of the CTR. For these reasons, the GTO can perform a stable inverter operation in the whole operation range from no-load running to full-load running.

The above-mentioned circuit configuration according to the present invention can perfectly prevent false firing at the GTO. However, when a transistor 8 is added to the signal transmission circuit and operated by a feedback signal from the transistor 7, as in a signal transmission circuit 31 in FIG. 7 which shows another embodiment of the present invention, the operation of the circuit shown in FIG. 6 can be improved. That is, the danger of the GTO kept at the ON-state being erroneously turned off is removed. In more detail, in the circuit construction shown in FIG. 6, if either of the transistors 2 and 4 is driven off by a noise current $i_3$ or $i_4$ shown in FIG. 7 at a period when all of the transistors 2, 2' and 4 are kept at the ON-state (namely, a turn-on period of the GTO), the output $v_o$ which is to be kept at the L-level, becomes high in potential. Thus, an extinguishing pulse is supplied to the GTO kept at the ON-state, and the so-called false extinguishing phenomenon is generated. The collector current of the transistor 2 is larger than that of the transistor 4 since the former is given as an amplified output from the transistor 2'.

Figure 7:
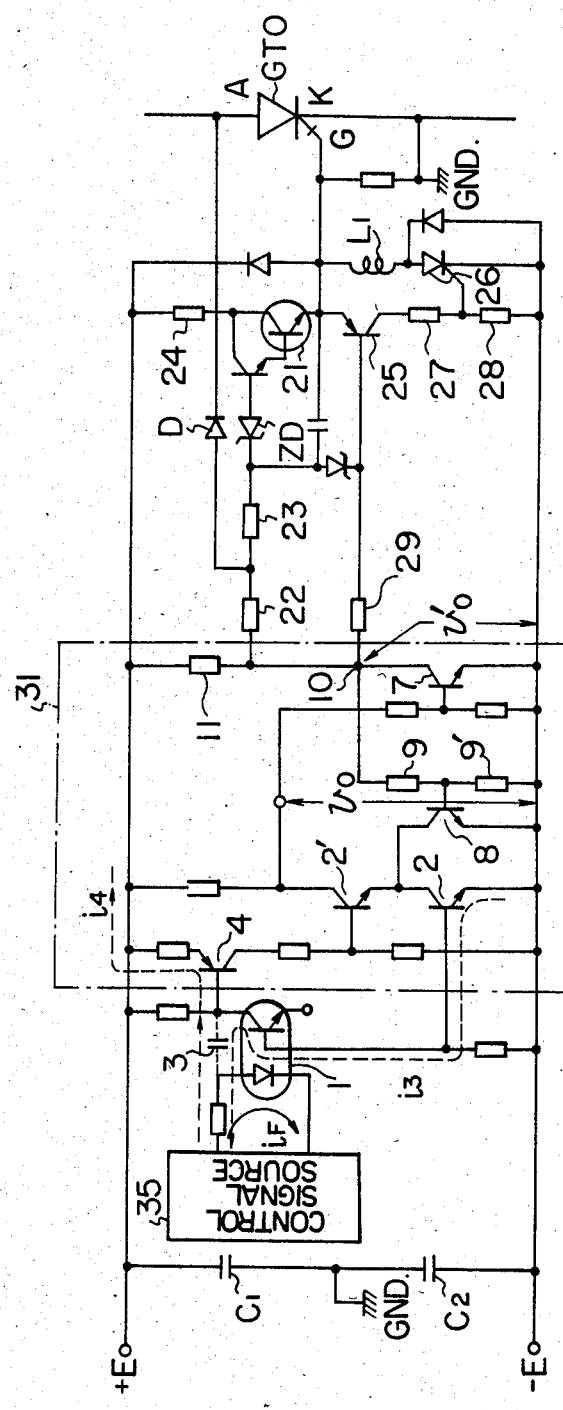
FIG. 7 is a circuit diagram showing another embodiment of the present invention in which a switching element for interlocking use is added to the embodiment shown in FIG. 6.

Thus, in an ordinary driving condition, the transistor 2 is rather insufficiently driven as compared with the transistor 4. Accordingly, the transistor 2 is readily affected by the noise current $i_3$, and moreover has an immediate influence on the output $v_o$. Therefore, it is required to surely maintain the transistor 2 at the ON-state (that is, to interlock the transistor 2) by operating the transistor 8 effectively. The transistor 4 is rather overdriven as compared with the transistor 2, and therefore can get out of the influence of the noise current $i_4$ only by appropriately selecting circuit constants of a peripheral circuit. Referring to FIG. 7 which shows an improved version of the circuit shown in FIG. 6, the newly-added transistor 8 is connected in parallel to the transistor 2, and resistors 9 and 9' are provided to determine an operating condition of the transistor 8. The outputs $v_o$ and $v_o'$ are opposite in level to each other. Accordingly, at a period when a turn-on gate signal is supplied from the gate circuit to the GTO, the otputs $v_o$ and $v_o'$ take the L-level and H-level, respectively, and a base current of the transistor 8 flows from a power source $+E$ to the transistor 8 through the resistors 9 and 11. As a result, the transistor 8 is put in the ON-state, and thus interlocks the transistor 2 so as not to increase the voltage between the collector and emitter of the transistor 2. As mentioned above, by connecting the transistor 2 and the transistor 8 for interlocking the transistor 2 in parallel, not only the false firing but also the false extingushing phenomenon can be prevented, and moreover the noise-resisting capability is enhanced.

In the foregoing explanation, the photo-coupler has been used as a signal insulating element, by way of example. However, the same effect can be obtained in the case where a pulse transformer 33 is used in place of the photo-coupler 1.

Next, explanation will be made on the operation of the embodiment shown in FIG. 7. Referring to FIG. 7, when a turn-on signal is applied to the photo-coupler 1, the transistor 7 is put in the OFF-state on the basis of the above-mentioned operation of the signal transmission circuit 31. Thus, the base current of the transistor 21 flows through the following path: turn-on power source $C_1$—resistor 11—resistor 22—resistor 23—zener diode ZD—base of transistor 21—emitter of transistor 21—gate of GTO—cathode of GTO—Gnd—$C_1$. Thus, the transistor 21 is made conductive, and a turn-on gate signal flows through a path $C_1$—resistor 24—transistor 21—gate of GTO—cathode of GTO—Gnd—$C_1$, to turn on the GTO. When the GTO is turned on, the current having flowed into the base of the transistor 21 is forced to flow through a path $C_1$—diode D—G-TO—Gnd—$C_1$. Thus, the transistor 21 is put in the OFF-state and therefore the gate current for turning on the GTO flows only for a short period. Since the transistor 7 is kept at the OFF-state, the turn-on gate signal is again supplied to the GTO if the GTO happens to be turned off.

When the GTO is turned off, the input signal $i_F$ supplied to the photo-coupler 1 is made zero in signal level, and the transistor 7 is put in the ON-state. Thus, a reverse bias current to the transistor 21 flows through the following path: turn-off power source $C_2$—Gnd—cathode of GTO—gate of GTO—emitter of transistor 21—base of transistor 21—zener diode ZD—resistor 23—resistor 22—transistor 7—$C_2$. Thus, the transistor 21 is rapidly put in the OFF-state. Subsequently, a current flows through a path $C_2$Gnd—cathode of GTO—gate of GTO—emitter of transistor 25—base of transistor 25—resistor 29—transistor 7—$C_2$ to put the transistor 25 in the ON-state. Thus, a gate current of the thyristor 26 flows through a path $C_2$—Gnd—cathode of GTO—gate of GTO—transistor 25—resistor 27—gate of thyristor 26—cathode of thyristor 26—$C_2$ to turn on the thyristor 26. Whereby, a turn-off gate current to the GTO flows through a path $C_2$—Gnd—cathode of GTO—gate of GTO—inductor $L_1$—thyrsitor 26—$C_2$ to turn off the GTO. When the GTO is turned off and the turn-off gate current becomes zero, the thyristor 26 is naturally turned off. However, the transistor 25 is kept conductive so long as the transistor 7 is maintained at the ON-stage, and therefore a reverse bias voltage is applied between the gate G and cathode K of the GTO through the resistor 27.

As has been explained in the foregoing, according to the present invention, a plurality of switching elements which form a signal transmission circuit in a gate circuit for turning on and off a semiconductor element, can transmit a signal only when the logical AND is obtained between the switching elements. Therefore, a gate circuit according to the present invention has a high noise-resisting capacity. Further, since the photo-coupler includes a light receiving element acting as a photo-diode, the response time of the photo-coupler is short, and it is difficult to be influenced by the variation of CTR. Further, when a different switching element is added to the switching elements for forming the signal transmission circuit in order to interlock one of these switching elements, the gate circuit according to the present invention does not generate the false extinguishing phenomenon, and therefore the noise-resisting capability of the gate circuit is more enhanced.

What is claimed is:

1. In a control circuit including a turn-on circuit for supplying a turn-on signal to a semiconductor element with a control electrode, and a signal transmission circuit for transferring a control signal from a control signal source to said turn-on circuit through a signal insulating element, to control said semiconductor element, said signal transmission circuit comprising:

a pair of first and second switching elements each provided on a corresponding one of two independent paths, said independent paths being arranged in such a manner that a noise current flowing through a stray capacity around said signal insulating element in case of change in a voltage in said control circuit flows through one of said paths but is prevented from flowing through both said paths at the same time, said first and second switching elements being made conductive when said control signal is supplied thereto through said signal insulating element, said control signal being transferred to said turn-on circuit only when said pair of switching elements are simultaneously made conductive; and a third switching element which is made conductive by a feed-back signal in said signal transmission circuit, connected in parallel to at least one of said pair of first and second switching elements.

2. A control circuit according to claim 1, wherein said semiconductor element with a control electrode is a gate turn-off thyristor.

3. A control circuit according to claim 2, wherein said signal insulating element is a photo-coupler.

4. A control circuit according to claim 2, wherein said signal insulating element is a pulse transformer.

5. In a control circuit including a turn-on circuit for supplying a turn-on signal to a semiconductor element with a control electrode, and a signal transmission circuit for transferring a control signal from a control signal source to said turn-on circuit through a photo-coupler having a photo-transister, to control said semiconductor element, said signal transmission circuit comprising:
- a first transistor having an emitter connected to a high voltage part, a collector connected to a low voltage part, and a base connected to a collector of said photo-transistor in said photo-coupler;
- a series combination of a second transistor and a third transistor, an end of said series combination being connected to said high voltage part, another end of said series combination being connected to said low voltage part, a base of said second transistor being connected to a base of said photo-transistor, a base of said third transistor being connected to said collector of said first transistor;
- a fourth transistor having a collector connected to said high voltage part, an emitter connected to said low voltage part, and a base connected to a collector of said third transistor; and
- an output terminal connected to a collector of said fourth transistor.

6. A signal transmission circuit according to claim 5, wherein said signal transmission circuit includes a fifth transistor having a collector connected to a junction of said second and third transistors, an emitter connected to said low voltage part, and a base connected to said collector of said fourth transistor.

7. In a control circuit including a turn-on circuit for supplying a turn-on signal to a semiconductor element with a control electrode, and a signal transmission circuit for transferring a control signal from a control signal source to said turn-on circuit through a pulse transformer, to control said semiconductor element, said signal transmission circuit comprising:
- a first transistor having an emitter connected to a high voltage part, a collector connected to a low voltage part, and a base connected to an end of said pulse transformer;
- a series combination of a second transistor and a third transistor, an end of said series combination being connected to said high voltage part, another end of said series combination being connected to said low voltage part, a base of said second transistor being connected to another end of said pulse transformer, a base of said third transistor being to said collector of said first transistor;
- a fourth transistor having a collector connected to said high voltage part, an emitter connected to said low voltage part, and a base connected to a collector of said third transistor; and
- an output terminal connected to a collector of said fourth transistor.

8. A signal transmission circuit according to claim 7, wherein said signal transmission circuit includes a fifth transistor having a collector connected to a junction of said second and third transistors, an emitter connected to said low voltage part, and a base connected to said collector of said fourth transistor.

9. In a control circuit including a turn-on circuit for supplying a turn-on signal to a semiconductor element with a control electrode, and a signal transmission circuit for transferring a control signal from a control signal source to said turn-on circuit through a signal insulating element, to control said semiconductor element, said signal transmission circuit comprising:
- a pair of first and second switching elements connected with a corresponding one of two independent outputs of said signal insulating element, said pair of first and second switching elements being simultaneously made conductive when said control signal is supplied thereto through said signal insulating element; and
- a third switching element being connected with said pair of first and second switching elements so that it is conductive only when said pair of switching elements are simultaneously conductive to thereby form a logical AND-function with said control signal on said two independent outputs, whereby a noise current flowing by means of electric charges stored by a stray capacitor around said signal insulating element in case of change of a voltage at an output point of the turn-on circuit is prevented from flowing through said pair of first and second switching elements at the same time.

10. A control circuit according to claim 9, wherein a fourth switching element which is made conductive by a feedback signal in said signal transmission circuit, is connected in parallel to at least one of said pair of first and second switching elements.

11. A control circuit according to claim 10, wherein said semiconductor element with a control electrode is a gate turn-off thyristor.

12. A control circuit according to claim 10, wherein said signal insulating element is a photo-coupler.

13. A control circuit according to claim 10, wherein said signal insulating element is a pulse transformer.

14. A control circuit according to claim 12, wherein said signal transmission circuit includes as said pair of first and second switching elements:
- a first transistor having an emitter connected to a high voltage part, a collector connected to a low voltage part and a base connected to a collector of a photo-transistor in said photo-coupler as said first output of said signal insulating element;
- a second transistor, series connected with a third transistor, which third transistor serves as said third switching element, an end of said series connection being connected to said high voltage part, another end of said series connection being connected to said low voltage part, a base of said second transistor being connected to a base of said photo-transistor as said second output of said signal insulating element, a base of said third transistor being connected to said collector of said first transistor; and
- a fourth transistor having a collector connected to said high voltage part and to said turn-on circuit, an emitter connected to said low voltage part and a base connected to a collector of said third transistor.

15. A control circuit according to claim 14, characterized in that said signal transmission circuit includes a fifth transistor as said fourth switching element having a collector connected to a junction of said second and third transistors, an emitter connected to said low voltage part and a base connected to said collector of said fourth transistor.

* * * * *